United States Patent
Chuang et al.

(10) Patent No.: US 12,020,962 B2
(45) Date of Patent: Jun. 25, 2024

(54) MEASURING SYSTEM AND METHOD OF MEASURING STATIC CHARGES

(71) Applicant: TAIWAN SEMICONDUCTOR MANUFACTURING COMPANY LTD., Hsinchu (TW)

(72) Inventors: Tzu-Sou Chuang, Hsinchu (TW); Chwen Yu, Taipei (TW); En Tian Lin, Hsinchu (TW); Chi Wen Kuo, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/461,285

(22) Filed: Aug. 30, 2021

(65) Prior Publication Data
US 2023/0063350 A1 Mar. 2, 2023

(51) Int. Cl.
*H01L 21/67* (2006.01)
*G01R 29/24* (2006.01)

(52) U.S. Cl.
CPC ........ *H01L 21/67276* (2013.01); *G01R 29/24* (2013.01)

(58) Field of Classification Search
CPC .......................... H01L 21/67276; G01R 29/02
See application file for complete search history.

(56) References Cited

U.S. PATENT DOCUMENTS

| | | | | | |
|---|---|---|---|---|---|
| 3,824,454 | A | * | 7/1974 | Stern | G01R 5/28 324/156 |
| 3,866,114 | A | * | 2/1975 | Johnston | G01R 5/28 324/452 |
| 4,886,593 | A | * | 12/1989 | Gibbs | C02F 1/48 204/667 |
| 11,175,261 | B1 | * | 11/2021 | Francis | F16L 55/38 |
| 2003/0057086 | A1 | * | 3/2003 | McLaine | C02F 1/4602 422/186.04 |
| 2020/0236766 | A1 | * | 7/2020 | Wei | H05F 3/04 |
| 2021/0123963 | A1 | * | 4/2021 | Wu | G01R 29/12 |

FOREIGN PATENT DOCUMENTS

| | | | | |
|---|---|---|---|---|
| CN | 110389261 A | * | 10/2019 | G01R 29/24 |
| JP | 3571701 B2 | * | 9/2004 | |

* cited by examiner

*Primary Examiner* — Feba Pothen
(74) *Attorney, Agent, or Firm* — WPAT LAW; Anthony King

(57) ABSTRACT

The present disclosure provides a measuring system. The measuring system includes an insulative tube, a capacitor and a static charge meter. The insulative tube is configured to allow a fluid to flow therethrough. The capacitor is disposed on a surface of a section of the insulative tube. The capacitor includes a first metallic layer, a second metallic layer opposite to the first metallic layer, and a dielectric layer sandwiched between the first metallic layer and the second metallic layer. The static charge meter is electrically coupled to the capacitor and configured to measure static charge accumulated inside the section of the insulative tube.

20 Claims, 12 Drawing Sheets

MEASURING SYSTEM AND METHOD OF MEASURING STATIC CHARGES

BACKGROUND

Static electricity is produced by accumulation of electrons on weak electrical conductors or insulating materials. Such materials may be gaseous, liquid or solid and may include flammable liquids, powders, plastic films and granules. Generation of static electricity may be caused by rapid separation of highly-insulated materials by friction or by transfer from one highly-charged material to another in an electric field by induction.

Electrostatic discharge (ESD) is a sudden flow of electricity between two electrically-charged objects caused by contact, electrical short or dielectric breakdown, and may be sufficient to cause serious electric shock. In the field of semiconductor manufacturing, static electricity control programs have been carefully applied throughout back-end processes of semiconductor assembly operations due to the known problems of electrostatic discharge damage causing yield and reliability issues. However, the issue of static electricity may become more serious in some advanced semiconductor manufacturing processes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
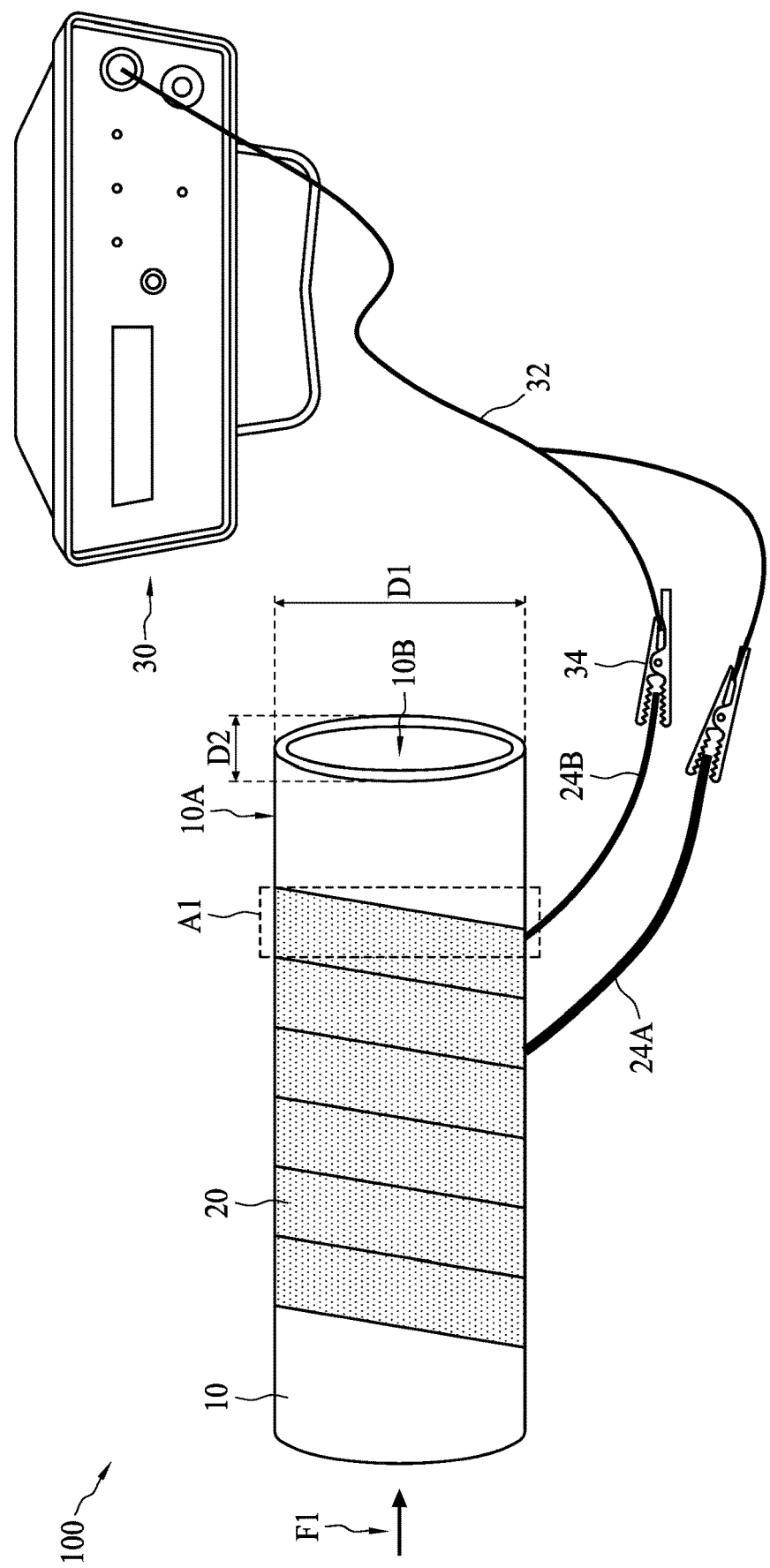
FIG. 1 is a schematic view showing a measuring system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in some embodiments to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the field of semiconductor manufacturing, processes such as photolithography and wet etching have become more sensitive to metals at advanced process nodes. For example, if metallic materials are used in a fluid-transporting system, undesired chemical reactions may occur between a metallic pipe and a transported chemical, which leads to an extraction of metallic particles from the metallic pipe. If the metallic particle-containing chemical is used in a semiconductor manufacturing process, critical defects may thereby be produced on wafers and impact production yields. As a result, non-metallic materials are used in the fluid-transporting system to prevent the extracted metallic particles.

However, an increased use of non-metallic materials such as fluoropolymer may raise concerns for an electrostatic discharge in components. For example, solvents used in the semiconductor industry have low conductivity, which causes them to easily hold electrical charge.

Several high-resistance fluids, such as butyl acetate and propylene glycol monomethyl ether acetate (PGMEA), are widely used in semiconductor manufacturing processes. Such fluids may induce static electric charges (also referred to as static charges) when passing through a component made of materials having resistances different from those of the fluids (e.g., polytetrafluoroethene (PTFE)) due to friction, and electrostatic discharge or arcing may occur accordingly.

A low-conductivity fluid flowing in a pipe or component may cause charge separation at the interface of the fluid and the pipe. As a result, negative charges may be generated or accumulated at such interface. Further, positive charges and negative charges in the pipe may be generated or accumulated respectively in proximity to the inner surface and the outer surface of the pipe. Such separation of charges is similar to a triboelectric effect wherein surfaces of two materials become oppositely charged after the two materials are rubbed together and then separated from each other.

FIG. 1 is a schematic view showing a measuring system 100, in accordance with some embodiments of the present disclosure. In some embodiments, the measuring system 100 includes an insulative tube 10, a capacitor 20 disposed on the insulative tube 10 and a static charge meter 30 electrically coupled to the capacitor 20. The insulative tube 10 includes an outer surface 10A and an inner surface 10B opposite to the outer surface 10A. In some embodiments, the insulative tube 10 has an outer diameter D1 and an inner diameter D2 less than the outer diameter D1. In some embodiments, the inner diameter D2 is in a range of about 5 to 10 centimeters (cm).

In some embodiments, the insulative tube 10 is a pipe made of non-metallic materials such as resin, plastic or glass fibers, and used for semiconductor manufacturing purposes. In some embodiments, the insulative tube 10 is made of polyvinyl fluoride (PVF), polyvinylidene fluoride (PVDF), polytetrafluoroethene (PTFE), perfluoroalkoxy alkanes (PFA), polyvinyl chloride (PVC), chlorinated polyvinyl chloride (CPVC), unplasticized polyvinyl chloride (UPVC), or the like.

In some embodiments, the insulative tube 10 is configured for carrying a fluid F1 flowing therethrough. The fluid F1 includes liquid or gaseous chemicals that are transported by the insulative tube 10. In some embodiments, the fluid F1 includes ultra-pure water (UPW), photoresist (PR), developing agents, organic solvents, nitrogen ($N_2$) or argon (Ar) gas. In some embodiments, the fluid F1 has an electrical resistance substantially greater than 10 megaohms (MΩ). In some embodiments, the fluid F1 has an electrical resistance range of about 10 to 20 MΩ. In some embodiments, the fluid F1 has an electrical resistance substantially greater than 20 MΩ. When the fluid F1 flows through the insulative tube 10, static charge may be created due to the friction between the fluid F1 and the insulative tube 10.

Figure 2:
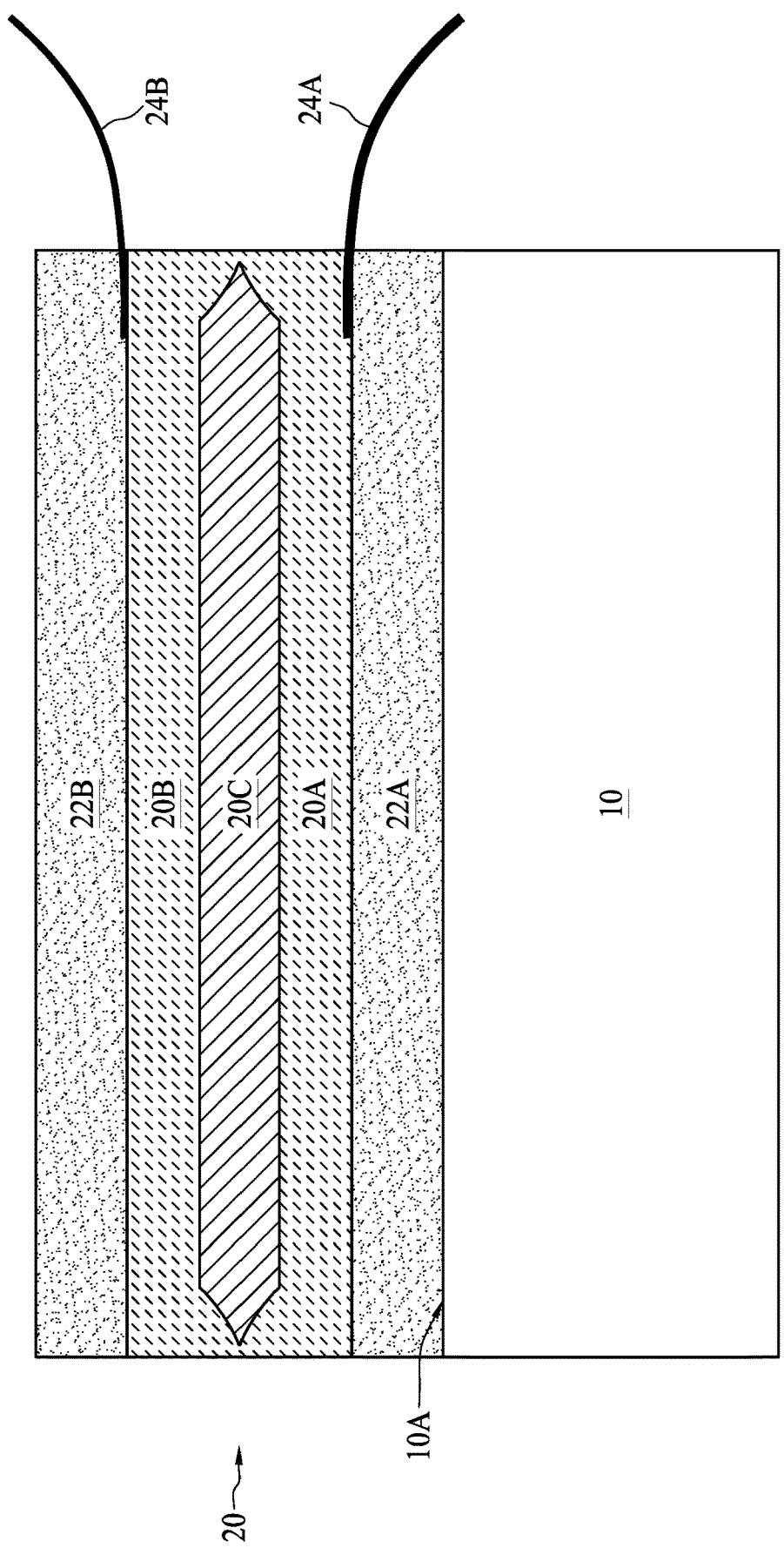
FIG. 2 is a schematic cross-sectional view showing a capacitor, in accordance with some embodiments of the present disclosure.

FIG. 2 is a schematic cross-sectional view showing the capacitor 20 encircled by a dashed line A1, in accordance with some embodiments of the present disclosure. Referring to FIGS. 1 and 2, in some embodiments, the capacitor 20 is flexible and can be wrapped around a section of the insulative tube 10. In some embodiments, the capacitor 20 is disposed on the outer surface 10A of the section of the insulative tube 10. In some embodiments, the capacitor 20 includes a first metallic layer 20A, a second metallic layer 20B opposite to the first metallic layer 20A, and a dielectric layer 20C sandwiched between the first metallic layer 20A and the second metallic layer 20B. In some embodiments, a portion of the first metallic layer 20A overlaps a portion of the second metallic layer 20B. In some embodiments, the first metallic layer 20A, the second metallic layer 20B and the dielectric layer 20C are made of hard and ductile materials such that the capacitor 20 as a whole is flexible.

In some embodiments, the dielectric layer 20C includes polyethylene (PE), polypropylene (PP) or polycarbonate (PC). In some embodiments, the dielectric layer 20C has a low dielectric permittivity. In some embodiments, the first metallic layer 20A and the second metallic layer 20B include copper (Cu), aluminum (Al), copper alloy, aluminum alloy, or the like. For example, the first metallic layer 20A and the second metallic layer 20B are copper foils or aluminum foils. In some embodiments, a thickness of the dielectric layer 20C is substantially less than a thickness of the first metallic layer 20A or a thickness of the second metallic layer 20B.

Referring to FIGS. 1 and 2, a first wire 24A and a second wire 24B are copper wires electrically coupled to the first metallic layer 20A and the second metallic layer 20B, respectively. In some embodiments, the first wire 24A is disposed on a surface of the first metallic layer 20A facing away the dielectric layer 20C and the second wire 24B is disposed on a surface of the second metallic layer 20B facing away the dielectric layer 20C.

In some embodiments, a first tape 22A and a second tape 22B including insulative tapes or electrical tapes that can insulate or protect the capacitor 20 are used. In some embodiments, the first tape 22A covers the first wire 24A and fixes the first wire 24A on the first metallic layer 20A. The first wire 24A is interposed between the first metallic layer 20A and the first tape 22A. In some embodiments, the second tape 22B covers the second wire 24B and fixes the second wire 24B on the second metallic layer 20B. The second wire 24B is interposed between the second metallic layer 20B and the second tape 22B.

Referring to FIG. 1, in some embodiments, the capacitor 20 is configured to surround a desired section of the insulative tube 10, for example, a position proximal to a source tank of the fluid F1 (e.g., butyl acetate) or near a production machine. In some embodiments, the capacitor 20 surrounds a section of the insulative tube 10 and leaves other sections of the insulative tube 10 exposed. Specifically, the capacitor 20 is wrapped around the outer surface 10A of the insulative tube 10, rather than being merely attached to the outer surface 10A. In some embodiments, the capacitor 20 closely contacts the insulative tube 10, rather than loosely surrounding the insulative tube 10. In some embodiments, the first and second metallic layers 20A and 20B are wrapped around the outer surface 10A of the insulative tube 10. In some embodiments, the first metallic layer 20A is entirely attached to the outer surface 10A of the section of the insulative tube 10, and the second metallic layer 20B is entirely isolated from the insulative tube 10. In some embodiments, the section of the insulative tube 10 wrapped by the capacitor 20 is substantially a hollow conductor.

Figure 3:
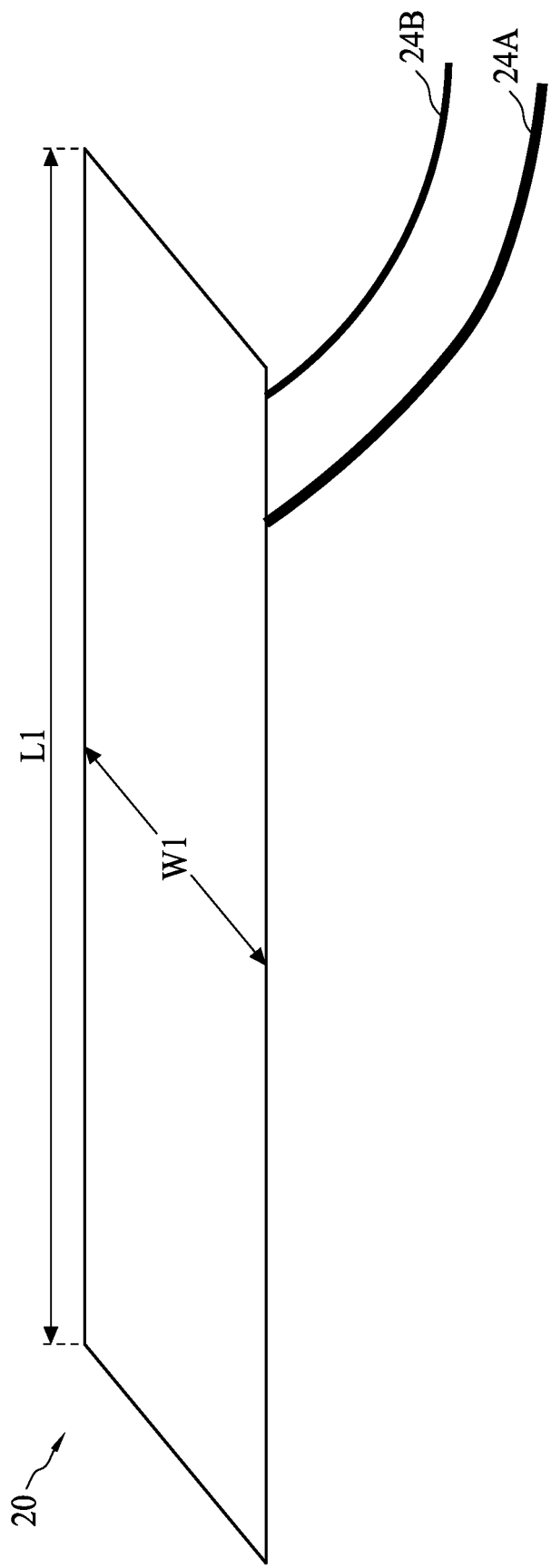
FIG. 3 is a schematic view showing the capacitor in FIG. 2 before wrapping, in accordance with some embodiments of the present disclosure.

FIG. 3 is a schematic view showing the capacitor 20 in FIG. 2 prior to wrapping, in accordance with some embodiments of the present disclosure. In some embodiments, the capacitor 20 is thin and flat before being used to wrap the insulative tube 10. In some embodiments, the capacitor 20 has a length L1 and a width W1 less than the length L1. In some embodiments, the length L1 is substantially greater than or equal to πD1, depending on different wrapping methods of the capacitor 20.

Figure 4:
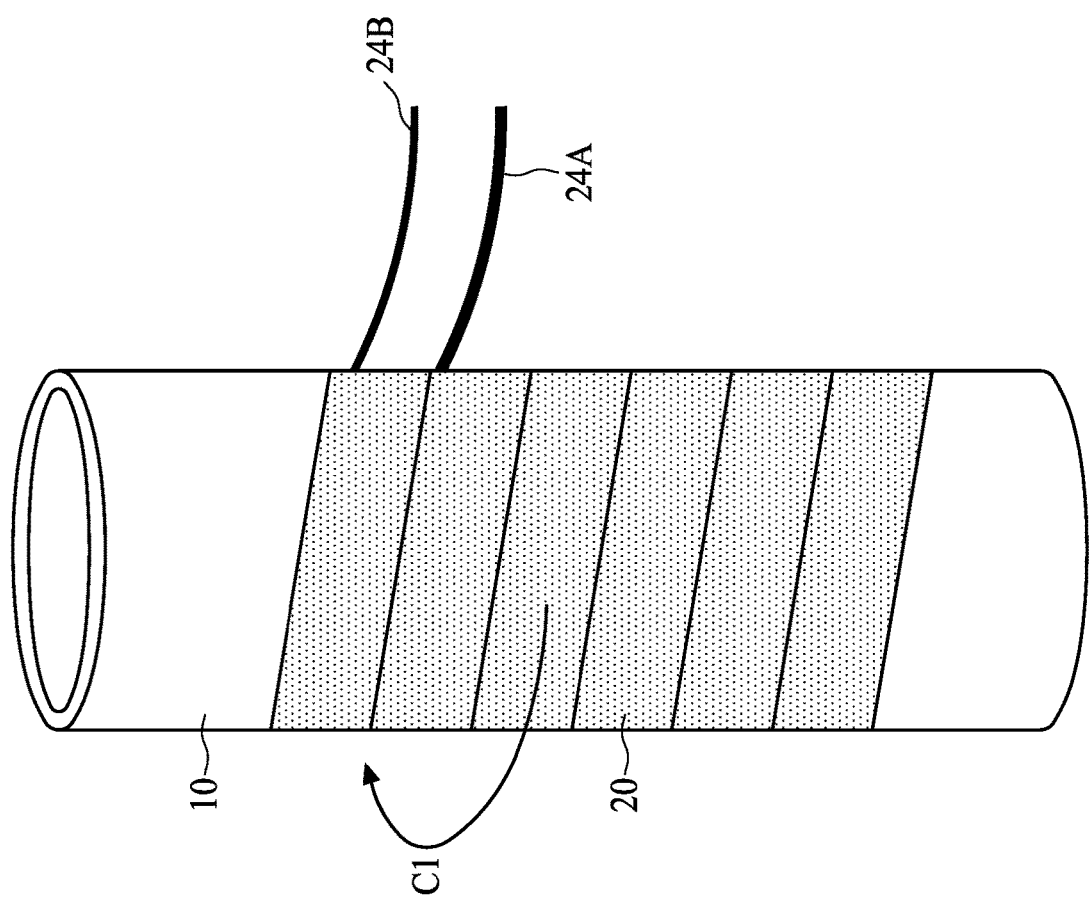
FIGS. 4 and 5 are schematic views showing different methods of wrapping the capacitor in FIG. 3 onto an insulative tube, in accordance with various embodiments of the present disclosure.
Figure 5:
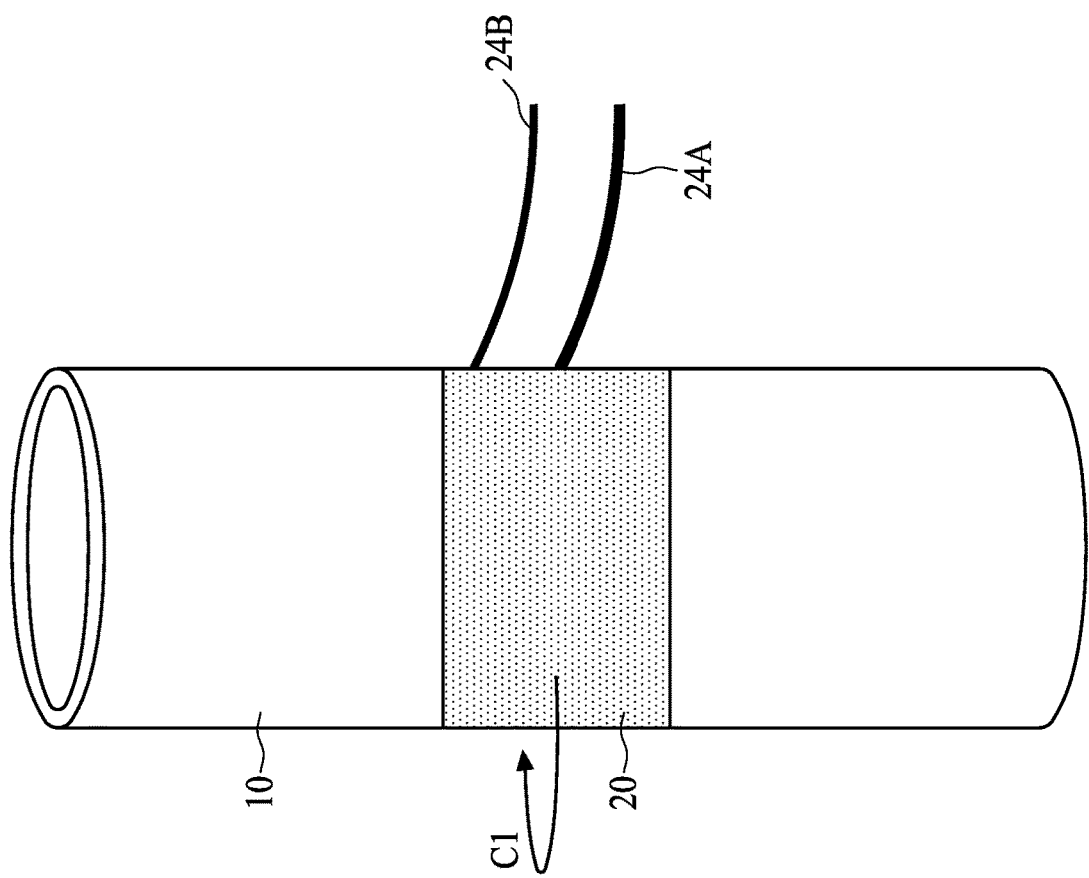

FIGS. 4 and 5 are schematic views showing different wrapping methods of the capacitor 20 on the insulative tube 10, in accordance with various embodiments of the present disclosure. Referring to FIG. 4, in some embodiments, a wrapping direction C1 of the capacitor 20 is diagonal in relation to a length direction of the insulative tube 10. In some embodiments, the capacitor 20 forms a helical shape on the insulative tube 10. In some embodiments, the configuration of the capacitor 20 is a hollow cylinder. Referring to FIG. 5, in other embodiments, the wrapping direction C1 of the capacitor 20 is perpendicular to the length direction of the insulative tube 10. In some embodiments, the capacitor 20 forms a ring shape on the insulative tube 10.

Referring back to FIG. 1, in some embodiments, the static charge meter 30 is a machine that can measure electrostatic charge accumulated on an object in coulombs (C). The static charge meter 30 can select detectable ranges of 0 to 20 nanocoulombs (nC), 0 to 200 nC, and 0 to 2000 nC. In some embodiments, the static charge meter 30 is disposed a predetermined distance away from the insulative tube 10 and the capacitor 20. The static charge meter 30 is connected to a power supply and therefore it can be operated continuously. In some embodiments, the position of the static charge meter 30 is fixed in order to reduce factors such as vibration that might influence the result of repeated manual measurements. In some embodiments, the static charge meter 30 may have a remote operating mode, that is, an operator can use a remote controller to control to the static charge meter 30 without touching buttons on the front panel of the static charge meter 30.

The static charge meter 30 may be used in combination with various capacitors for taking a measurement of an electrostatic charge inside a capacitor. According to the definition of capacitance, the amount of charge held or stored by an object is proportional to the capacitance or the voltage, as represented by the formula $q=CV$, in which $q$ is an amount of charge (measured in coulombs (C)), $C$ is capacitance (measured in farads (F)), and $V$ is voltage (measured in volts (V)).

In some embodiments, the static charge meter 30 is coupled to the capacitor 20 and configured to measure a static charge accumulated inside the section of the insulative tube 10 surrounded by the capacitor 20. In some embodiments, a cable 32 and clips 34 are used to connect the static charge meter 30 to the capacitor 20. The cable 32 can be a y-shaped cable with one end connected to a pair of clips 34 and the other end connected to an input terminal on the front panel of the static charge meter 30. One of the clips 34 is connected to the first wire 24A and the other of the clips 34 is connected to the second wire 24B.

In some embodiments, the static charge meter 30 may be coupled with a parametric amplifier (not shown). In some embodiments, the charge caused by electrostatic induction at the static charge meter 30 can be converted to an alternating current that is proportional to an electric field strength of the charge, and the parametric amplifier may measure the current without loss in relation to the electric field strength. The distribution of the static charge in the capacitor 20 is related to the size and shape of the capacitor 20, and therefore the geometry of each of the metallic layers 20A and 20B can be tuned to ensure the consistency of the measurement result of the static charge. In some embodiments, the static charge accumulated inside the section of the insulative tube 10 wrapped by the capacitor 20 (which is substantially a hollow tubular capacitor) is measurable by the static charge meter 30.

Figure 6:
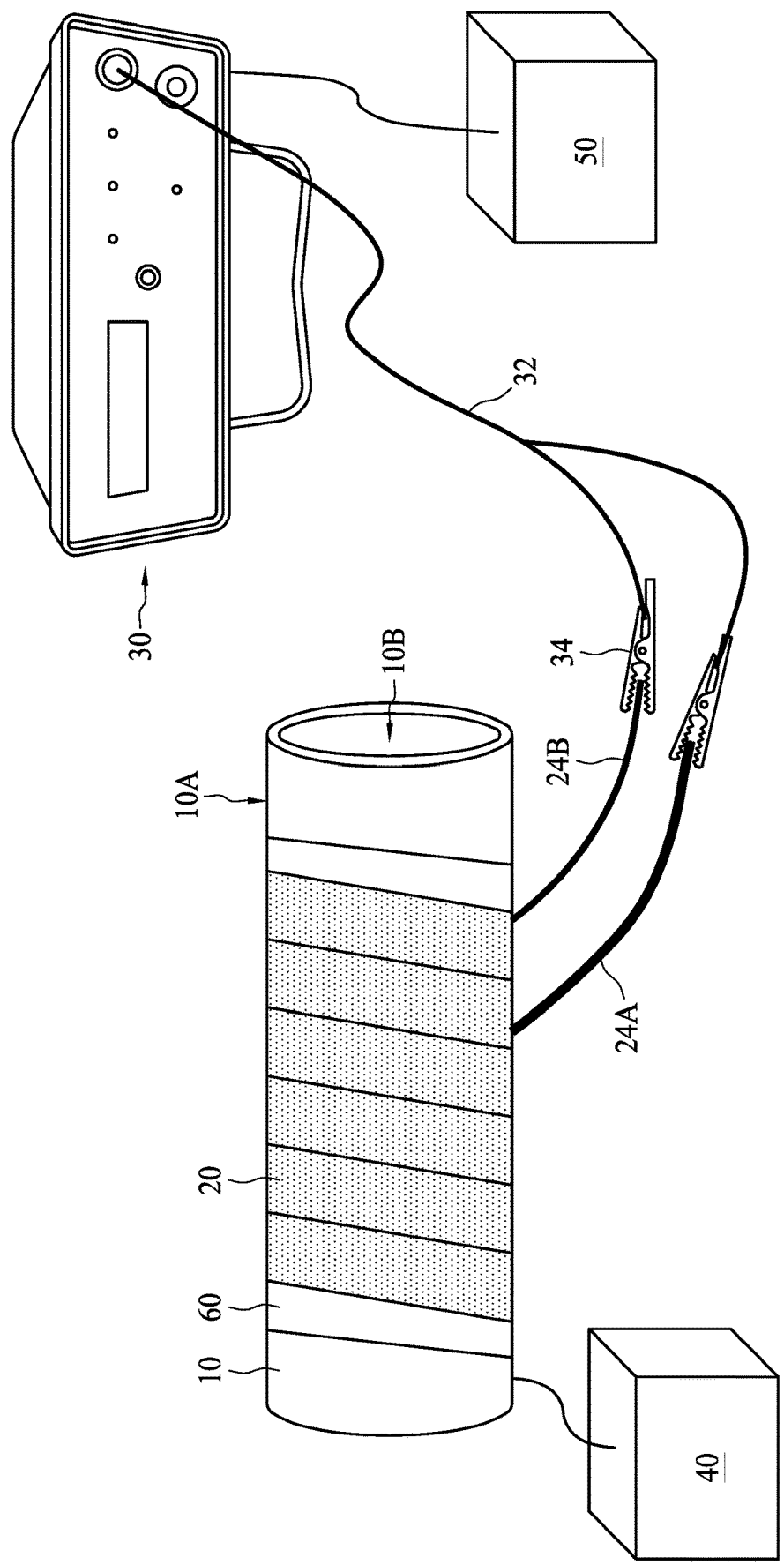
FIGS. 6 and 7 are schematic views showing other apparatuses being used with the measuring system in FIG. 1, in accordance with various embodiments of the present disclosure.
Figure 7:
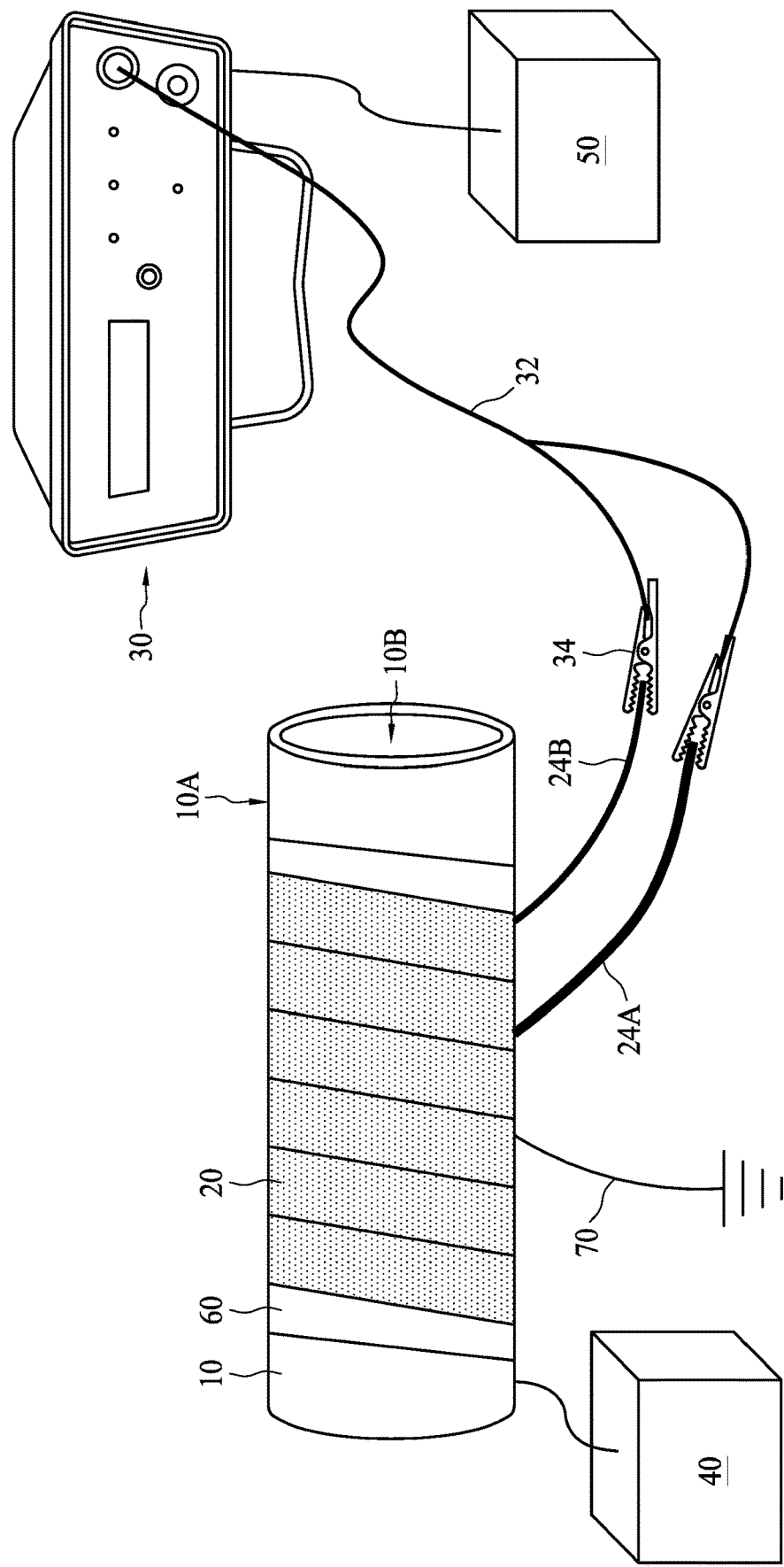

FIGS. 6 and 7 are schematic views showing other apparatuses being used with the measuring system 100, in accordance with various embodiments of the present disclosure. Referring to FIG. 6, in some embodiments, a pump 40 may be disposed between a source tank (not shown) of the fluid F1 and one end of the insulative tube 10. In some embodiments, the pump 40 can be operated automatically or manually and employed to draw in the fluid F1 from the source tank or expel the fluid F1 into the insulative tube 10. In some embodiments, the pump 40 can be used to increase or decrease the flow rate of the fluid F1. In some embodiments, the pump 40 may be paused such that the fluid F1 can be in a static state in the insulative tube 10.

In some embodiments, a computer 50 may be used in combination with the static charge meter 30 or the pump 40. In some embodiments, the computer 50 can be used to adjust the flow rate of the fluid F1 flowing through the insulative tube 10 according to static charge data collected by the static charge meter 30. Therefore, a relationship between the amount of static charge caused by the fluid F1 and the flow rate of the fluid F1 can be analyzed using a combination of the measuring system 100, the pump 40 and the computer 50. In addition, in order to avoid conditions that lead to electrostatic discharge and arcing, the data collected by the static charge meter 30 can be continuously transmitted to the computer 50. In some embodiments, a real-time alarm may be set to automatically adjust the flow rate of the fluid F1 when a measured amount of static charge exceeds a threshold value, so that the flow rate may be suitably adjusted in accordance with the amount of static charge accumulated in the insulative tube 10.

There are several factors that contribute to generation of static charge in a pipe. The accumulation of static charge in the insulative tube 10 may be affected by properties of the insulative tube 10 or the fluid F1. When the inner diameter of the insulative tube 10 is decreased or the length of the insulative tube 10 is increased, the tendency to accumulate static charge is also increased. Furthermore, physical or chemical properties such as dielectric constant, volume resistivity, surface resistivity or electronegativity of the material of the insulative tube 10 may be related to the generation of static charge. For example, a large proportion of pipes in factories are made of non-metal materials such as plastic.

When the insulative tube 10 is made of fluorine-containing materials such as polyvinyl fluoride (PVF), polyvinylidene fluoride (PVDF) or polytetrafluoroethene (PTFE), the insulative tube 10 tends to attract static charge more easily when transporting the chemical materials because of the high electronegativity of fluorine, and therefore a greater static charge is generated in the insulative tube 10. On the other hand, when the resistance, the dielectric constant, or the relaxation time constant of the fluid F1 is increased, the generation or accumulation of static charge may be increased concurrently. For example, static charge is created due to friction, particularly, when the resistance of chemical materials is high. As resistance of the fluid F1 is increased, conductivity of the fluid F1 is decreased and the fluid F1 becomes a weak electrolyte or non-electrolyte, thus causing a greater tendency to generate static charge.

In some cases, the generation or accumulation of static charge in the insulative tube 10 may be affected by properties of both the insulative tube 10 and the fluid F1. For example, the insulative tube 10 and the fluid F1 flowing therein have different electrical resistances. When there is a greater difference in the electrical resistances of the two materials, a greater charge may be created between the interface of the insulative tube 10 and the fluid F1.

The generation or accumulation of static charge in the insulative tube 10 may arise from other factors. For example, when the flow rate of a high-resistance fluid such as butyl acetate is too high (e.g., exceeding about 0.7 m$^3$/s), the amount of static charge and the total static electricity will increase accordingly. In some cases, an electric potential may be generated from friction by a person walking in a factory. As a result, electrostatic discharge or arcing may occur in the insulative tube 10 because of the accumulation of static charge, thereby producing contamination particles and affecting product yield.

Still referring to FIG. 6, in order to reduce the accumulation of static charge on the outer surface 10A of the insulative tube 10, in some embodiments, a metallic plate 60 may be disposed between the insulative tube 10 and the capacitor 20. The metallic plate 60 is an electrostatic shielding layer configured to prevent the external electrostatic field from entering the insulative tube 10 that is to be measured. In some embodiments, the metallic plate 60 is a thin and removable metallic foil that can be easily removed from a space between the insulative tube 10 and the capacitor 20. The metallic plate 60 may be used to reduce undesired static charge created from, for example, a robot arm or an operator moving around the insulative tube 10.

Referring to FIG. 7, in some embodiments, the capacitor 20 is connected to an electrical ground 70 in order to prevent the buildup of static charge caused by various factors. In some embodiments, the metallic plate 60 and the electrical ground 70 can be selectively disposed in the measuring system 100. In some embodiments, the electrical ground 70 is a wire or cable that is used to transfer unwanted static charge to the ground. In some embodiments, the static charge meter 30 itself is grounded. For example, the static charge meter 30 may have an electrical terminal (not shown) on its front or rear panel that is grounded. In such embodiments, the capacitor 20 may be grounded when it is connected to the static charge meter 30.

Figure 8:
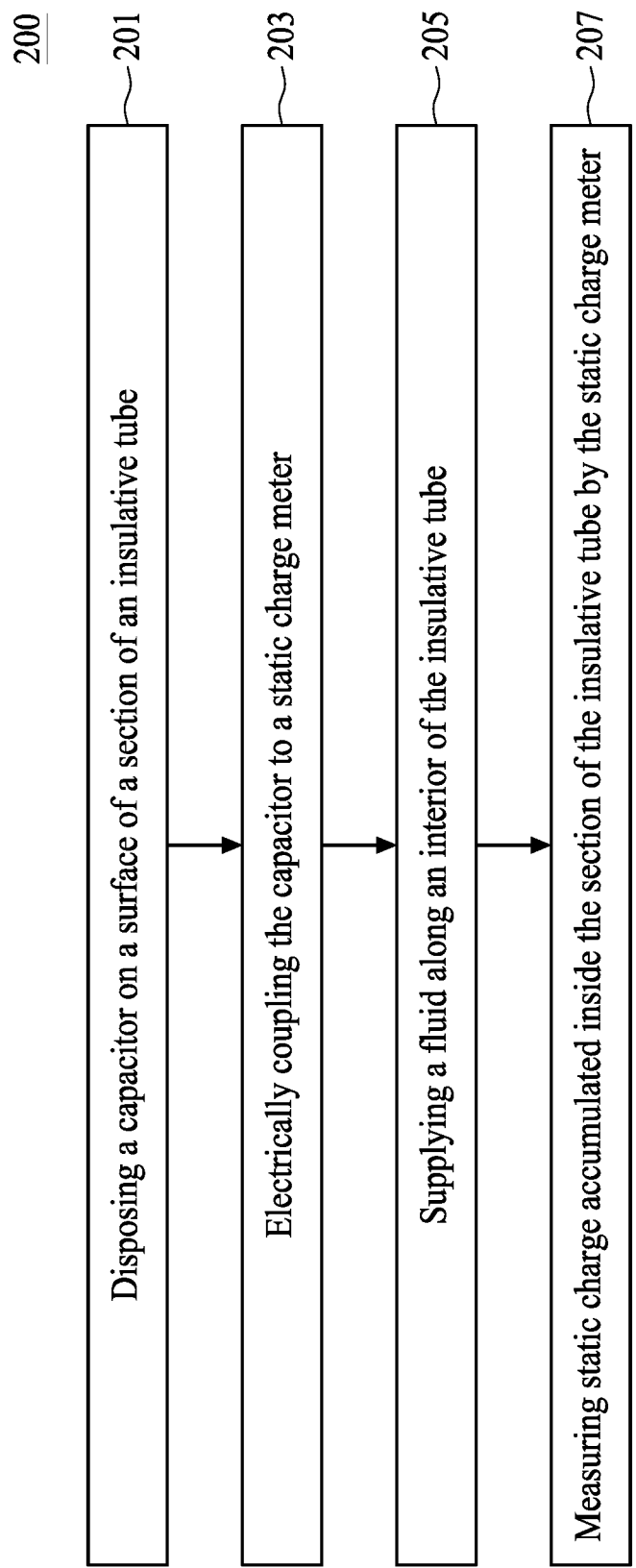
FIG. 8 is a flow diagram showing a method of measuring static charge, in accordance with some embodiments of the present disclosure.

FIG. 8 is a flow diagram showing a method 200 of measuring static charge, in accordance with some embodiments of the present disclosure. FIGS. 9 to 12 are schematic views illustrating sequential operations of the method 200 in FIG. 8, in accordance with some embodiments of the present disclosure. In performing the operations of the method 200, the measuring system 100 disclosed in FIG. 1 is utilized, and repeated description of elements and their functions related to the measuring system 100 in FIGS. 2 to 4 is omitted herein for brevity.

Figure 9:
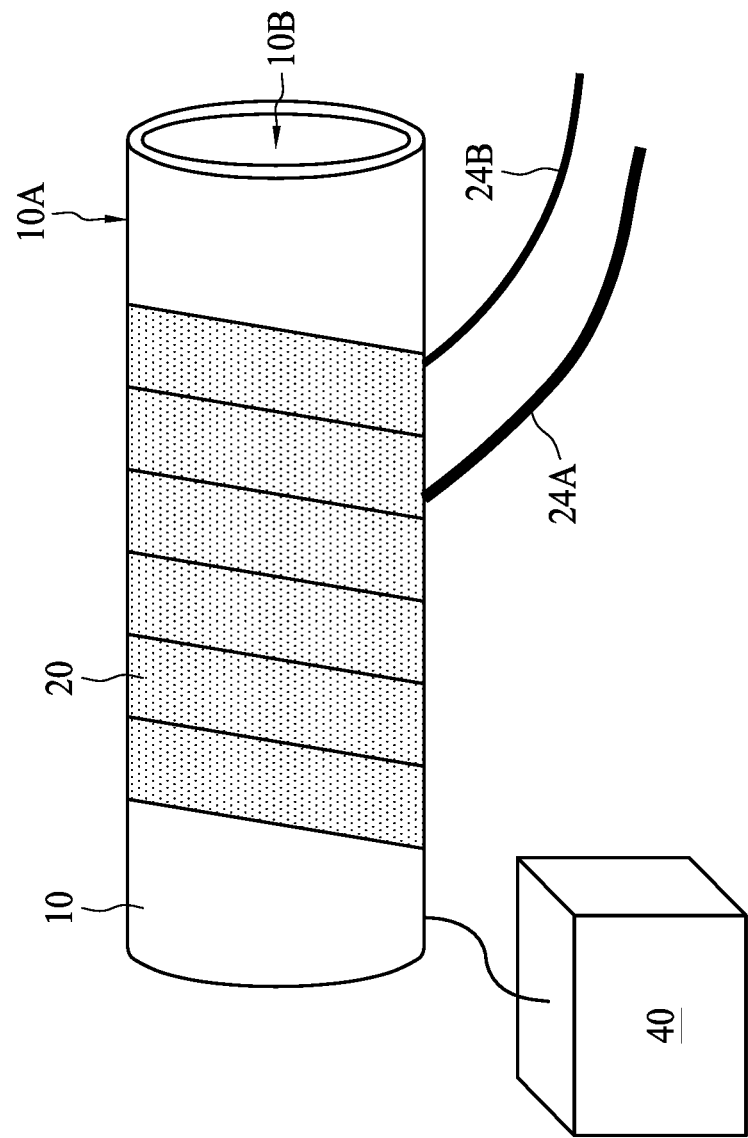
FIGS. 9 to 12 are schematic views illustrating sequential operations of the method in FIG. 8, in accordance with some embodiments of the present disclosure.

In operation 201, a capacitor 20 is disposed on an outer surface 10A of a section of an insulative tube 10, as shown in FIG. 9. The insulative tube 10 may be a pipe used for transporting liquid or gaseous chemicals. In some embodiments, the section of the insulative tube 10 is entirely surrounded by the capacitor 20, i.e., no gap that leaves a portion of the insulative tube 10 exposed is present in the section. In some embodiments, the capacitor 20 is flexible and can be helically wrapped around the section of the insulative tube 10. In some embodiments, a first wire 24A and a second wire 24B are electrically coupled to the capacitor 20. In some embodiments, a pump 40 may be disposed at one end of the insulative tube 10.

Figure 10:
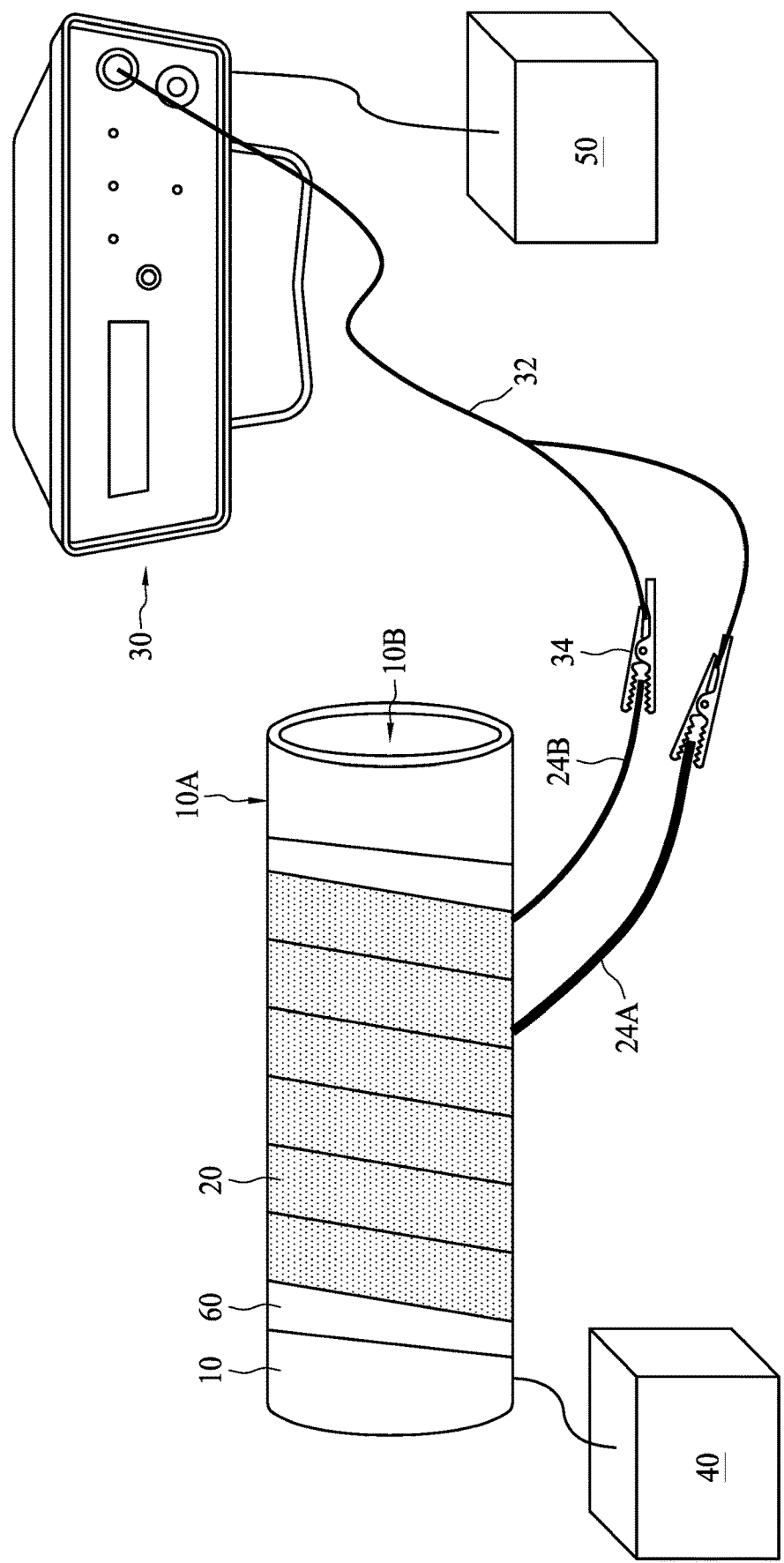

In operation 203, the capacitor 20 is electrically coupled to a static charge meter 30, as shown in FIG. 10. In some embodiments, the static charge meter 30 is disposed a predetermined distance away from the insulative tube 10 in order to reduce an operator's access to the insulative tube 10 and reduce undesired external static charge induced by the operator when the measurement is started. In some embodiments, a cable 32 and clips 34 are used to connect the first wire 24A and the second wire 24B to the static charge meter 30.

In some embodiments, the pump 40 is connected to one end of the insulative tube 10 and a computer 50 is used in combination with the static charge meter 30 or the pump 40. In some embodiments, a metallic plate 60 is disposed between the insulative tube 10 and the capacitor 20. The metallic plate can be easily removed from a space between the insulative tube 10 and the capacitor 20. In some embodiments, the capacitor 20 or the static charge meter 30 is grounded.

Figure 11:
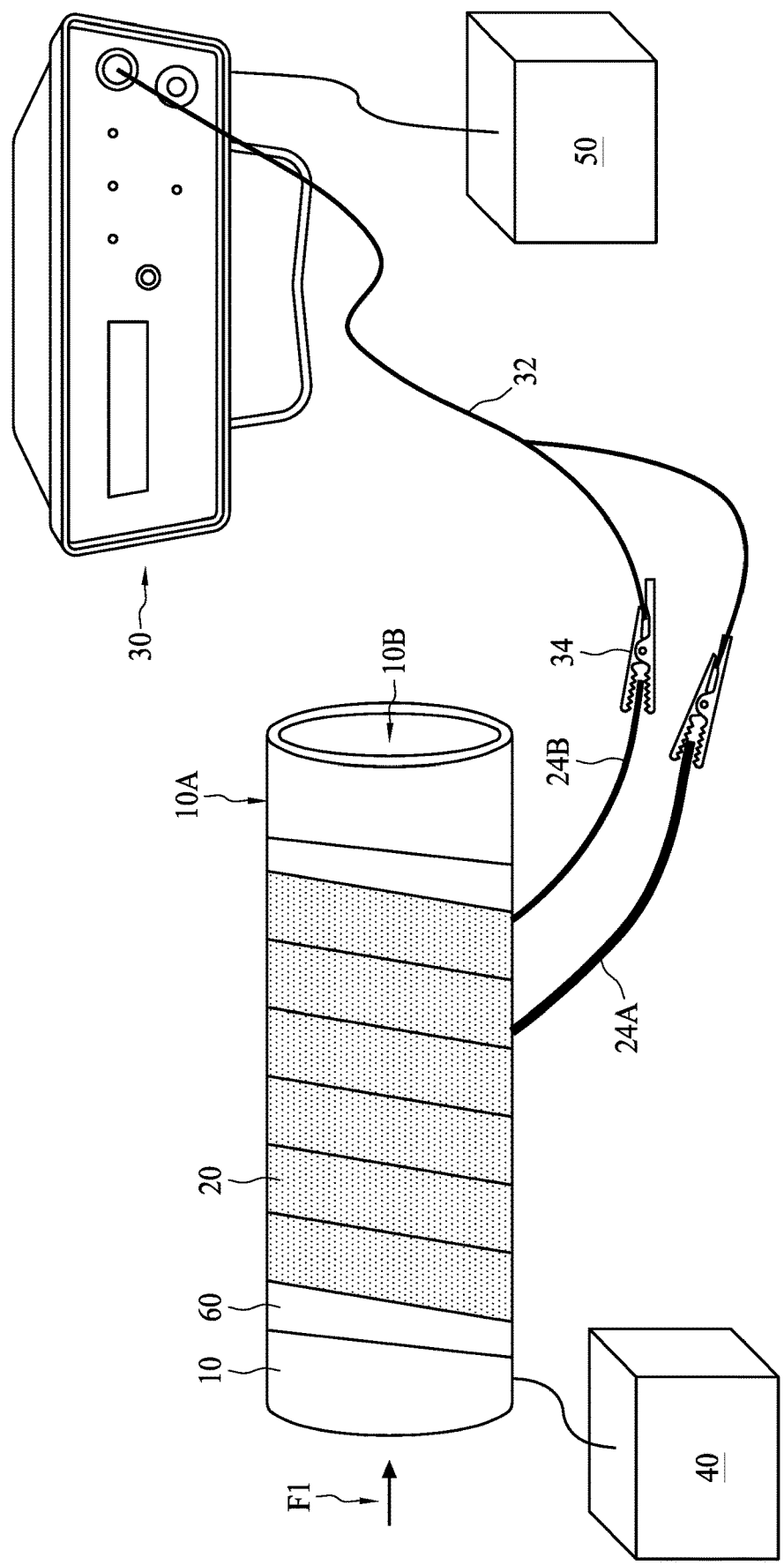

In operation 205, a fluid F1 is supplied along an interior of the insulative tube 10, as shown in FIG. 11. In some embodiments, the fluid F1 is flowed along the inner surface 10B of the insulative tube 10. In some embodiments, a duration of the flow of the fluid F1 through the insulative tube 10 during the static charge measurement can be programmed by controlling the pump 40. For example, in some embodiments, a flow rate of the fluid F1 along the insulative tube 10 can be increased, decreased or paused by controlling the pump 40 operated by a person or the computer 50 during the static charge measurement. In some embodiments, a low flow rate of the fluid F1 is used to keep the static charge detected by the static charge meter 10 below a threshold voltage that might cause arcing or electrostatic discharge.

Figure 12:
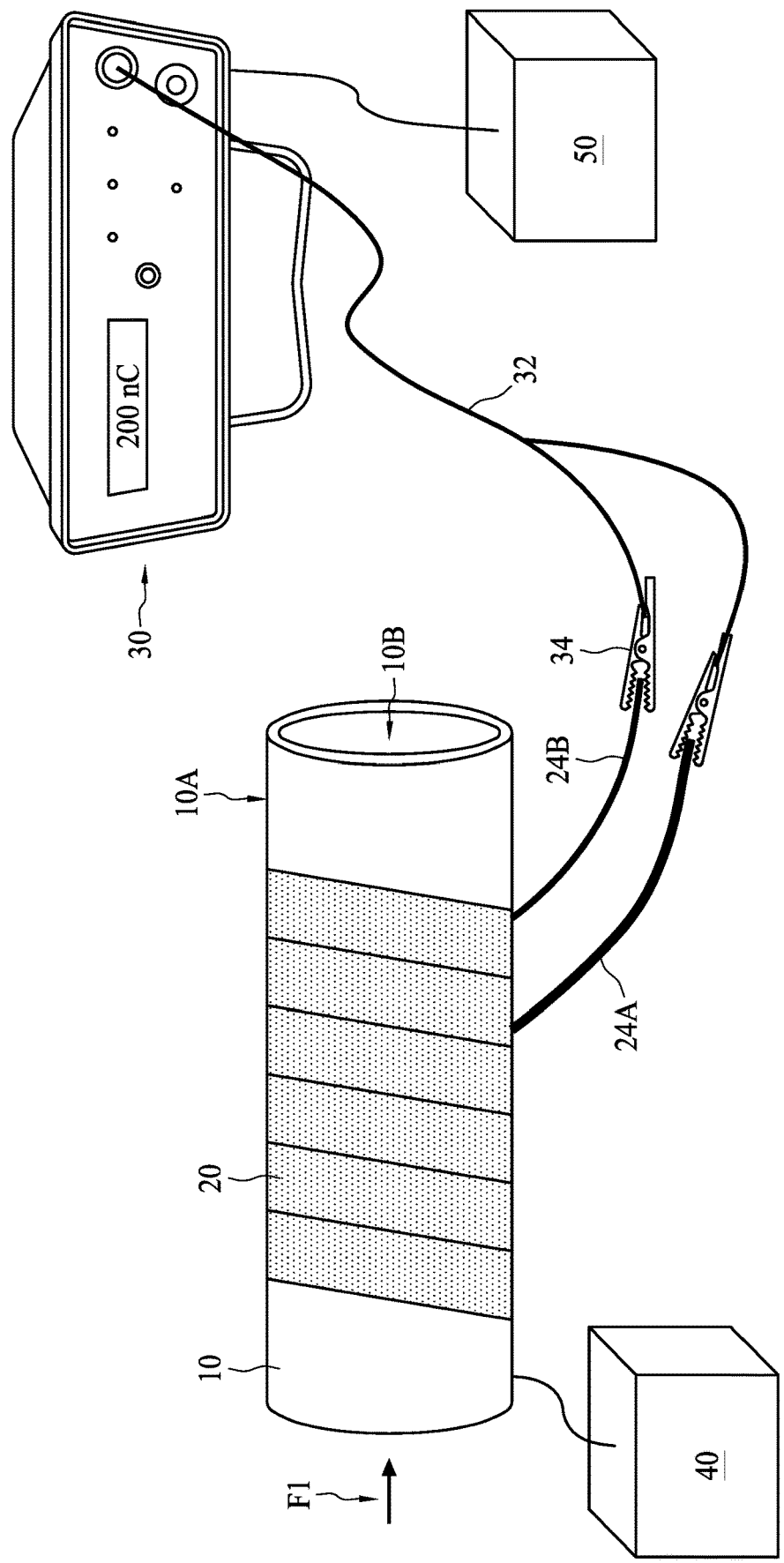

In operation 207, the static charge accumulated inside the section of the insulative tube 10 is measured by the static charge meter 30, as shown in FIG. 12. In some embodiments, the static charge accumulating on the inner surface 10B of the section of the insulative tube 10 can be measured by the static charge meter 30 connected to the capacitor 20. In some embodiments, the capacitor 20 is configured in a helical or hollow cylinder manner uses the principle of induced charge to maximize the induced electric field and the induced electric charge in the insulative tube 10.

In some embodiments, the measuring system 100 can be used to measure the static charge of the fluid F1 in pipes of different diameters or lengths. Because the capacitor 20 is wrapped around the section of the insulative tube 10, the capacitor 20 can be utilized as an antenna to measure static charge inside the insulative tube 10 according to the relationship q=CV. The amount of static charge q can be derived by multiplying a capacitance C obtained from the capacitor 20 and a voltage V provided by the static charge meter 30 and used to charge the section of the insulative tube 10 surrounded by the capacitor 20.

In some embodiments, the measurement of the static charge is performed for a duration of about $10^{-1}$ to $10^3$ seconds (s). In some embodiments, data associated with the static charge on the inner surface of the section of the insulative tube 10 is measured by the static charge meter 30 and transmitted to the computer 50. In some embodiments, after the measured data is processed by the computer 50, the flow rate of the fluid F1 injected into the insulative tube 10 can be automatically adjusted in real time by the computer 50 based on the data generated by the static charge meter 30.

The static charge induced by the fluid F1 flowing in the insulative tube 10 is the measurement target. However, many external factors that might generate static charge are present in the measurement environment as long as two insulative objects with different electric resistances are brought into contact, rubbed together and separated. Such undesired charge may influence the static charge meter 30 and cause inaccurate measuring results. In some embodiments, before the static charge is measured, the static charge meter 30 needs to be calibrated. In some embodiments, the static charge meter 30 can be calibrated by resetting (zeroing) it after the supplying of the fluid F1 and before the measuring of the static charge.

In some embodiments, the static charge meter 30 is sensitive and able to detect a change of static charge within the degree of several nanocoulombs. In some embodiments, before the static charge meter 30 is calibrated, the metallic plate 60 remains disposed between the insulative tube 10 and the capacitor 20 so as to reduce static charge coming from the external environment instead of from the fluid F1. In some embodiments, the metallic plate 60 is removed after calibration of the static charge meter 30. In some embodiments, the static charge measurement is performed shortly after the removal of the metallic plate 60 and the calibration of the static charge meter 30. In some embodiments, an operator can use a remote controller to calibrate the static charge meter 30 without needing to touch buttons on the panel of the static charge meter 30.

Static electric charge might cause electrostatic discharge or arcing that can have a significant impact on wafers that encounter fluids or that contain the static electric charge. Such impact includes particle contamination or wafer scrap. The amount of static charge or the total amount of static electricity of the fluids should be monitored for determining whether to take further action, such as real-time reduction of the flow rates of the fluids.

In the field of fluid measuring, generally, high-resistance fluids are often volatile solvents, and thus off-line sampling is dangerous and generally difficult. In addition, it may not be possible for the off-line sampling to be continuously performed, and an amount of background static electricity may easily be influenced by a magnetic field and/or an electrical field from a nearby human body. Moreover, static charges at points on surfaces of pipes made of non-metal materials are not easily moved, so the distribution of potential at the surface of the pipes is not even.

The present disclosure is directed to a measuring system and a method of measuring static charge using the measuring system. A flexible and rectangular capacitor including a dielectric layer sandwiched between a pair of metallic layers is used to wrap a fluid pipe in a helical or cylindrical manner. The capacitor can be closely connected to the outer surface of the pipe and can be used to increase the amount of induced charge. The section of the fluid pipe surrounded by the capacitor becomes a hollow conductor and is coupled to a static charge meter. The static charge meter is used to measure an amount of static charge on an inner surface of the section of the fluid pipe.

The measuring system can be installed quickly at the measurement site and applied to various tubes or pipes of different diameters or lengths. In addition, the measuring system is suitable for measuring static charges accumulated under different flow conditions such as high or low flow rates or start/pause state in the pipe. The method of measuring static charge does not require removal of a fluid analyte from the pipe. In addition, there is no need to perform any pipe modification. Without a need to cut off the supply of the fluid, the amount of static charge carried by the fluid in the pipe can be measured directly and accurately. Moreover, the change of accumulated static charge before and after flow of the fluid through the pipe can be measured and compared.

The measuring system can be utilized in a semiconductor manufacturing system for maintaining the quality of a fluid for semiconductor processing. By placing the capacitor and the static charge meter at different positions near the pipe, even though a large quantity of high-resistance fluids are transported therethrough continuously and at high flow rates, the change of the static charge generated or accumulated in the semiconductor manufacturing system may be monitored easily, safely, and automatically. The measuring system and method may be used to replace off-line sampling.

One aspect of the present disclosure provides a method of measuring static charge. The method includes disposing a capacitor on a surface of a section of an insulative tube, wherein the capacitor includes a first metallic layer, a second metallic layer opposite to the first metallic layer, and a dielectric layer sandwiched between the first metallic layer and the second metallic layer; electrically coupling the capacitor to a static charge meter; supplying a fluid along an interior of the insulative tube; and measuring the static charge accumulated inside the section of the insulative tube by the static charge meter.

In some embodiments, the disposing of the capacitor includes entirely surrounding the section of the insulative tube by the capacitor.

In some embodiments, the disposing of the capacitor includes helically wrapping the capacitor around the section of the insulative tube.

In some embodiments, an end of the capacitor is connected to an electrical ground, or an electrical terminal of the static charge meter is grounded.

In some embodiments, the method further includes calibrating the static charge meter before the measuring of the static charge.

In some embodiments, the calibrating of the static charge meter includes resetting the static charge meter after the supplying of the fluid and before the measuring of the static charge.

In some embodiments, the method further includes disposing a metallic plate between the insulative tube and the capacitor; and removing the metallic plate after the calibrating of the static charge meter and before the measuring of the static charge.

In some embodiments, the measuring of the static charge is performed for a duration of about $10^{-1}$ to $10^3$ seconds.

One aspect of the present disclosure provides another method of measuring static charge. The method includes wrapping a flexible capacitor around a section of a pipe, wherein a fluid is disposed inside the pipe; and measuring the static charge accumulating on an inner surface of the section of the pipe by a static charge meter connected to the flexible capacitor.

In some embodiments, the method further includes increasing, decreasing or pausing a flow rate of the fluid along the pipe during the measuring of the static charge.

In some embodiments, the method further includes programming the duration of the flow of the fluid through the pipe during the measuring of the static charge; and transmitting a data associated with the static charge on the inner surface of the section of the pipe measured by the static charge meter to a computer.

Another aspect of the present disclosure provides a measuring system. The measuring system includes an insulative tube, a capacitor and a static charge meter. The insulative tube is configured for a fluid flowing therethrough. The capacitor is disposed on a surface of a section of the insulative tube. The capacitor includes a first metallic layer, a second metallic layer opposite to the first metallic layer, and a dielectric layer sandwiched between the first metallic layer and the second metallic layer. The static charge meter is electrically coupled to the capacitor and configured to measure static charge accumulated inside the section of the insulative tube.

In some embodiments, the capacitor is flexible.

In some embodiments, the first metallic layer is entirely attached to the surface of the section of the insulative tube, and the second metallic layer is entirely isolated from the insulative tube.

In some embodiments, the capacitor forms a helical shape.

In some embodiments, the dielectric layer includes polyethylene (PE), polypropylene (PP) or polycarbonate (PC).

In some embodiments, the first metallic layer or the second metallic layer includes aluminum.

In some embodiments, a thickness of the dielectric layer is substantially less than a thickness of the first metallic layer or a thickness of the second metallic layer.

In some embodiments, the fluid has an electrical resistance substantially greater than 10 megaohms (MΩ).

In some embodiments, a portion of the first metallic layer overlaps a portion of the second metallic layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods and steps.

What is claimed is:

1. A method of measuring static charge, comprising:
    disposing a capacitor on an outer surface of a section of an insulative tube, wherein the capacitor includes a first metallic layer on the outer surface of the section of the insulative tube, a second metallic layer opposite to the first metallic layer, and a dielectric layer sandwiched between the first metallic layer and the second metallic layer;
    disposing an electrostatic shielding layer between the insulative tube and the capacitor;
    electrically coupling the capacitor to a static charge meter;
    supplying a fluid along an interior of the insulative tube;
    measuring the static charge accumulated at an inner surface of the section of the insulative tube by the static charge meter, wherein the fluid is separated from the capacitor; and
    calibrating the static charge meter.

2. The method of claim 1, wherein the disposing of the capacitor includes entirely surrounding the section of the insulative tube by the capacitor.

3. The method of claim 1, wherein the disposing of the capacitor includes helically wrapping the capacitor around the section of the insulative tube.

4. The method of claim 1, wherein an end of the capacitor is connected to an electrical ground, or an electrical terminal of the static charge meter is grounded.

5. The method of claim 1, wherein the calibrating of the static charge meter is implemented after the supplying of the fluid and the measuring of the static charge.

6. The method of claim 1, wherein the calibrating of the static charge meter includes resetting the static charge meter after the supplying of the fluid and the measuring of the static charge.

7. The method of claim 1, after the measuring of the static charge, further comprising:
    removing the electrostatic shielding layer.

8. The method of claim 1, wherein the measuring of the static charge is performed for a duration of about $10^{-1}$ to $10^3$ seconds.

9. A method of measuring a static charge, comprising:
    wrapping a flexible capacitor around an outer surface of a section of an insulative pipe, wherein a fluid is disposed inside the insulative pipe, and the flexible capacitor includes:
        a first metallic layer in contact with the outer surface of the section of the insulative pipe;
        a dielectric layer on the first metallic layer; and
        a second metallic layer on the dielectric layer;
    disposing an electrostatic shielding layer between the insulative pipe and the flexible capacitor;
    electrically coupling the flexible capacitor to a static charge meter;
    calibrating the static charge meter;
    removing the electrostatic shielding layer; and
    measuring the static charge accumulating on an inner surface of the section of the insulative pipe by the static charge meter connected to the flexible capacitor.

10. The method of claim 9, further comprising increasing, decreasing or pausing a flow rate of the fluid along the insulative pipe during the measuring of the static charge.

11. The method of claim 9, further comprising:
    programming a duration of the flow of the fluid through the insulative pipe during the measuring of the static charge; and
    transmitting a data associated with the static charge on the inner surface of the section of the insulative pipe measured by the static charge meter to a computer.

12. A measuring system, comprising:
    an insulative tube configured for a fluid flowing through an inner surface of the insulative tube;
    a capacitor disposed on an outer surface of a section of the insulative tube, wherein the capacitor includes:
        a first metallic layer, contacting the outer surface of the section of the insulative tube;
        a dielectric layer, on the first metallic layer and isolated from the insulative tube by the first metallic layer; and
        a second metallic layer, on the dielectric layer;

a static charge meter electrically coupled to the capacitor and configured to measure a static charge accumulated on the inner surface of the section of the insulative tube;

a first insulative tape, covering the first metallic layer; and a second insulative tape, covering the second metallic layer, wherein the first insulative tape, the first metallic layer, the dielectric layer and the second metallic layer and the second insulative tape surround the outer surface of the section of the insulative tube.

13. The measuring system of claim 12, wherein the capacitor is flexible.

14. The measuring system of claim 12, wherein the second metallic layer is entirely isolated from the insulative tube.

15. The measuring system of claim 12, wherein the capacitor forms a helical shape.

16. The measuring system of claim 12, wherein the dielectric layer includes polyethylene (PE), polypropylene (PP) or polycarbonate (PC).

17. The measuring system of claim 12, wherein the first metallic layer or the second metallic layer includes aluminum.

18. The measuring system of claim 12, wherein a thickness of the dielectric layer is substantially less than a thickness of the first metallic layer or a thickness of the second metallic layer.

19. The measuring system of claim 12, wherein the fluid has an electrical resistance substantially greater than 10 megaohms (MΩ).

20. The measuring system of claim 12, wherein a portion of the first metallic layer overlaps a portion of the second metallic layer.

* * * * *